United States Patent [19]
Chun

[11] Patent Number: 6,166,980
[45] Date of Patent: Dec. 26, 2000

[54] REFRESH CONTROLLER IN SEMICONDUCTOR MEMORY

[75] Inventor: Jun-Hyun Chun, Cheongju, Rep. of Korea

[73] Assignee: Hyundai Electronics Ind., Co., Ltd., Ichon-shi, Rep. of Korea

[21] Appl. No.: 09/428,501

[22] Filed: Oct. 28, 1999

[30] Foreign Application Priority Data

Oct. 28, 1998 [KR] Rep. of Korea ............... 98-45363

[51] Int. Cl.[7] ........................................... G11C 7/00
[52] U.S. Cl. ........................................... 365/222; 365/233
[58] Field of Search ................... 365/222, 200, 365/233

[56] References Cited

U.S. PATENT DOCUMENTS

| 5,644,545 | 7/1997 | Fisch | 365/222 |
| 5,933,377 | 8/1999 | Kidaka | 365/222 |
| 5,991,218 | 11/1999 | Kushiyama | 365/222 |
| 5,999,473 | 12/1999 | Harrington et al. | 365/222 |

*Primary Examiner*—Son T. Dinh

[57] ABSTRACT

Semiconductor memory includes a plurality of cell blocks, with each cell block including a plurality of memory cells. The refresh controller refreshes a refresh defect cell in one of the cell blocks when a memory cell in a different one of the cell blocks and designated by a same address as the refresh defect cell is refreshed.

21 Claims, 10 Drawing Sheets

FIG. 8B

| ENSR | ENLP | AX[11] | AX[12] | BX0 | BX1 | BX2 | BX3 |
|------|------|--------|--------|-----|-----|-----|-----|
| L | L | L | L | L | H | L | L |
| L | L | L | H | L | H | L | H |
| L | L | H | L | H | L | H | L |
| L | H | H | H | L | L | L | L |
| L | H | L | L | L | H | L | H |
| L | H | H | H | H | H | L | H |
| H | L | L | L | H | L | H | L |
| H | L | H | L | L | H | L | L |
| H | L | L | H | H | H | L | H |
| H | L | H | H | L | H | L | H |
| H | H | L | L | H | L | H | L |
| H | H | H | L | L | L | L | L |
| H | H | L | H | L | L | L | H |
| H | H | H | H | L | L | H | L |

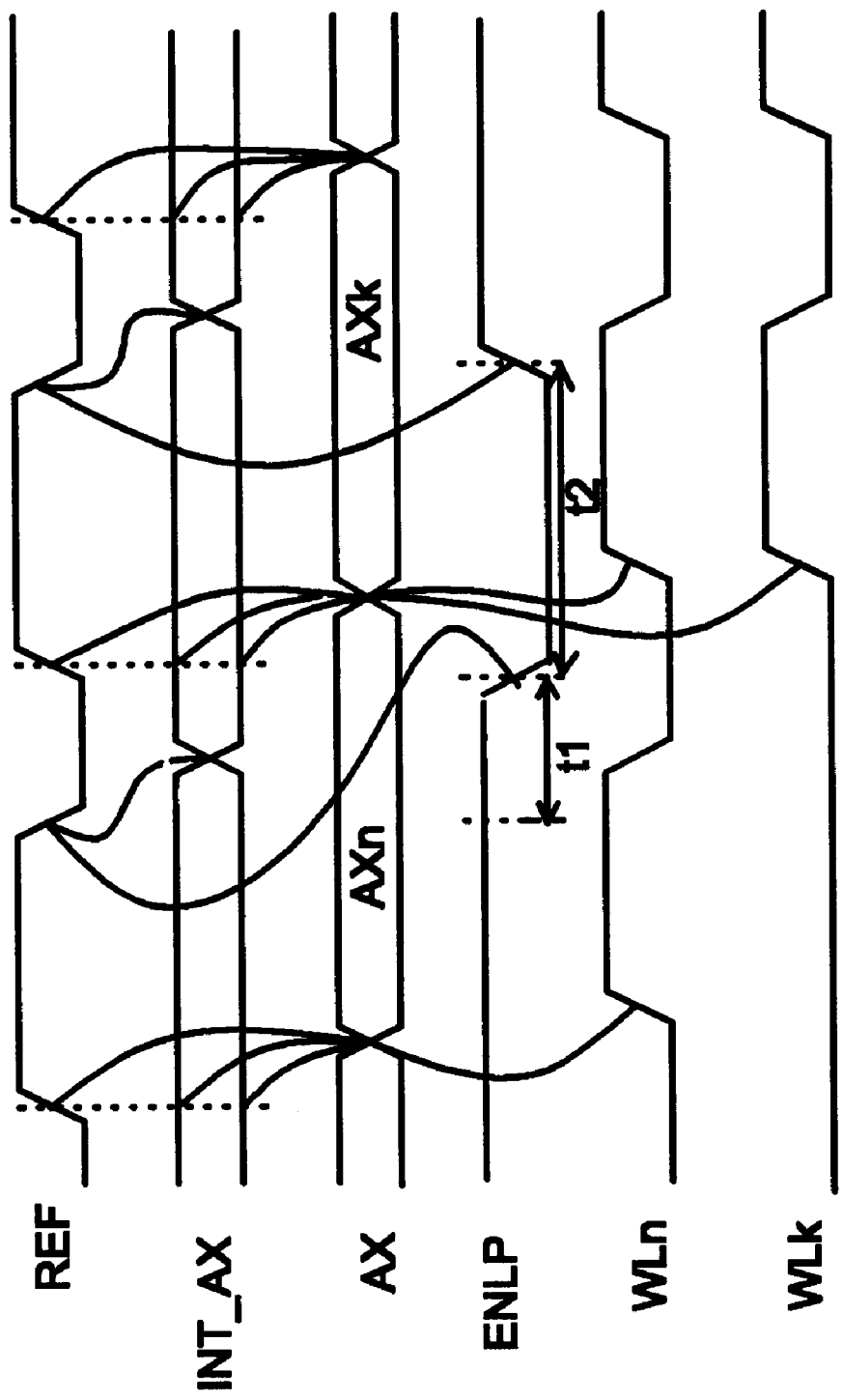

REFRESH CONTROLLER IN SEMICONDUCTOR MEMORY

BACKGROUND OF THE INVENTION

1. Field of Invention

The present invention relates to a refresh controller in semiconductor memory that controls the refresh cycle of a memory cell array.

2. Discussion of Related Art

Memory cells in DRAM should, ideally, be arranged as a square matrix. Accordingly, a specific cell may be selected by decoding 24 address bits wherein half of the address bits are to identify a row and the other half of the address bits are to identify a column. Since each number of the row address bits and column address bits are 12, it is possible to reduce the external address pins to 12 by supplying the row address signals and the column address signals alternately through the 12 external address pins. This is called address multiplexing, which simplifies the packaging process.

For the address multiplexing above mentioned, an address latch is required for separation of the row address bits and the column address bits. Additionally, a row address strobe signal/RAS, indicating the row address input, and a column address strobe signal/CAS, indicating the column address input, are also required for the address multiplexing.

Accordingly, a function that synchronizes the input of the row address and the column address with the row address strobe signal/RAS and the column address strobe signal/CAS, respectively, is required. And, a row address latch and a column address latch are also required also.

According to this, in 16 M DRAM, address pins are reduced from 24 to 13. 12 pins are for the address signals and the other pin is for the column address strobe signal. The row address signal is sent over the chip enable signal pin. Thus, no additional pins are required for the row address strobe signal.

The row address signal and the column address signal are inputted from the address pins to internal circuitry at a certain time interval. The initial input path to the row address decoder and column address decoder is same. However, the decoding stage is divided into multiple stages such as predecoding and main decoding as the number of address bits increase.

There are two different ways of separating the input path of the row address signal and the column address signal. One way is to separate them after being stored in an address buffer. The other way is to separate them right before the predecoder, and, in this case, the input path of the row address signal and the column address signal share the address buffer. For 16 M DRAM and higher, the way of separating the input path of the row address signal and the column address signal before the row address buffer and column address buffer can be generalized.

Refresh operation in DRAM is carried out when the row address strobe signal is "low" level and after a refresh address is inputted. This is called 'RAS Only Refresh'.

Such refresh operation has to be done before the cell capacitor is discharged and unable to indicate whether data is logic "1" or "0". This critical time is called a refresh period.

A refresh cycle is defined as the number of times required to complete refresh of all memory cells in memory cell array. The refresh period divided by the refresh cycle gives the refresh interval. This refresh interval determines a time interval of each refresh cycle so that the refresh operation is executed at regular intervals.

There are many different kind of refresh operations in a DRAM such as automatic refresh, hidden refresh, self refresh and the like.

In 64 K DRAM, a refresh signal is applied to a spare pin. This refresh signal determines the acceptance of the internal address. Namely, if the refresh signal is activated (i.e. low level) prior to the row address strobe signal, the refresh operation in following cycles is carried out using the internal address, and an external address is ignored. After the refresh operation for a wordline is finished, the internal address counter counts up 1 bit for the next refresh cycle. Thus an external refresh counter is not necessary.

There is another way of refresh control which uses abnormal operation of a DRAM. So-called CAS before RAS (CBR) refresh, a type of automatic refresh, is an example of this kind of refresh control. Instead of the refresh signal, the column address strobe signal is activated prior to the row address strobe signal (i.e. CAS before RAS). A refresh controller regards the abnormal operation as the refresh signal, and this eliminates the need for a signal pin. In this case, a built-in internal address counter generates internal addresses used to refresh, and an external address is ignored.

In order to make CBR refresh effective, the column address strobe signal needs to be activated at a time tCSR (/CAS set up time) prior to the row address strobe signal and maintained for at least an amount of time tCHR(/CAS hold time).

FIG. 1 is a block diagram that shows a conventional address input stage connected to a memory cell array in semiconductor memory.

As shown in FIG. 1, the address input stage has a row address latch 103 and a column address latch 105 within the address input buffer 101. The row address is stored in row address latch 103 and the column address is stored in column address latch 105. These stored addresses are decoded by decoder to select a memory cell to read or write data.

The TTL level external address signal of 12 bits is inputted to the address input buffer 101 through an address input pad. The address input buffer 101 converts the external address signal TTL to the CMOS level external address signal EXT_A'.

The external address signal EXT_A is comprised of the external row address signal EXT_AX and the external column address signal EXT_AY. These two external address signals EXT_AX and EXT_AY are output from the address input buffer 101 alternately. The converted external row address signal EXT_AX is stored in the row address latch 103, and the converted external column address signal EXT_AY is stored in the column address latch 105.

An internal address counter 102 receives the refresh signal REF. When the refresh signal REF is activated to high level, the internal address counter 102 generates an internal address signal INT_AX[11:01], which is supplied to the row address latch 103. In this case, the internal address signal INT_AX is an internal 'row' address signal.

As above mentioned, the internal address signal INT_AX and the external row address signal EXT_AX are latched in the row address latch 103. In addition, the refresh signal REF and the wordline driving signal ACT are also supplied to the row address latch 103.

The row address latch 103 latches the internal address signal INT_AX when the refresh signal REF is activated to high level, and latches the row address signal EXT_AX when the wordline driving signal ACT is activated to high level.

A row predecoder 104 receives and predecodes the internal address signal INT_AX stored in the row address latch 103 or the row address signal EXT_AX.

The predecoding operation in the row predecoder 104 will now be described.

The row predecoder 104 generates two block address signals BX0 and BX1 by decoding the most significant bit of the internal address signal INT_AX or the most significant bit of row address signal EXT_AX. Each block address signal BX0 and BX1 selects two of four cell blocks. The entire memory cell array is divided into plural cell blocks, and each cell block is designated by a unit address input.

The remaining bits of the internal address signal INT_AX or the row address signal EXT_AX are the actual row address signal AX for selecting a single wordline in the cell block selected by the block address signals BX0 and BX1.

Every cell block 107 has its own row decoder 108 as a main decoder. The row decoder 108 receives one bit of the two block address signals BX0 and BX1 and the predecoded row address signal AX. Thus the row decoder 108 is selected by the block address signals BX0 and BX1. The selected row decoder 108 decodes the row address signal AX to select a corresponding wordline.

The column address latch 105 receives a read/write signal RD/WT and also receives the external column address signal EXT_AY from the input buffer 101. The column address latch 105 latches the column address signal EXT_AY when the read/write signal RD/WT is activated.

The external column address signal EXT_AY in the column address latch 105 is supply to the column predecoder 106. The column predecoder 106 generates the column address signal AY by predecoding the column address signal EXT_AY. The column decoder 109 decodes the predecoded column address signal AY to select the corresponding bitline. Every cell block 107 has a sense amplifier 110. The sense amplifier 110 is activated by decoded column address AY and carries out read/write and refresh operations. Each sense amplifier controllers 111, indicated by SAC in FIG. 1 and associated with a sense amplifier 110, generates a read/write control signal and a refresh control signal to control the sense amplifier 110.

FIG. 2 shows a timing diagram of the address input stage in FIG. 1, and in particular, a timing diagram of the refresh operation using the internal address signal INT_AX. In FIG. 2, the internal address signal INT_AX is generated by the activated refresh signal REF. The actual row address is taken from the decoded internal address signal INT_AX. Assuming that the row address signals AXk and AXn are generated, two wordlines WLk and WLn are selected.

These two selected wordlines WLk and WLn are in separate cell blocks. Since two cell blocks are selected by the unit row address, just one wordline corresponding the unit row address is selected and activated in each selected cell block. If the memory cell array has more cell blocks (i. e. more cells), higher power consumption will occur. And, since this refresh capability is not enough to refresh a highly integrated memory, the refresh failure rate increases.

Generally, a defective memory cell is repaired by an available redundant memory cell. But, there is a limitation on redundancy in semiconductor memory. Thus, only an extremely defective memory cell is repaired by a redundant memory cell.

A refresh defect means that a memory cell requires more refresh current or a longer refresh period than a normal cell due to larger leakage current than a normal cell. In other words, a refresh defect memory cell is a memory cell which has refresh defects. Since defective cells (i.e. refresh defective cells) require more current to be refreshed than normal cells, refresh time is determined by defective cells. But, in fact, there are more normal cells than defective cells in a memory cell array. Thus, determining the refresh timing based on defective cells is very inefficient from a standpoint of power consumption.

SUMMARY OF THE INVENTION

The present invention is directed to a refresh controller in semiconductor memory that substantially obviates one or more of the problems due to limitations and disadvantages of the related art.

As such, an object of the present invention is to provide a refresh controller in semiconductor memory that refreshes both a normal memory cell and a defective memory cell designated by the same address, but which are located in separate memory cell blocks, when the normal memory cell is refreshed.

To achieve these and other advantages and in accordance with the purpose of the present invention, as embodied and broadly described, the present invention of a semiconductor memory includes a semiconductor memory, comprising a plurality of cell blocks, each cell block including a plurality of memory cells, and a refresh controller refreshing a refresh defect cell in one of said cell blocks when a memory cell in a different one of said cell blocks and designated by a same address as said refresh defect cell is refreshed.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this application, illustrate embodiments of the inventing and together with the description serve to explain the principle of the invention.

In the drawings:

FIG. 8B is a diagram that shows a truth table of a row address decoder; and

FIG. 9 is a timing diagram of operational characteristics of an address input stage.

DETAILED DESCRIPTION OF PREFERRED EMBODIMENTS

Reference will now be made in detail to the preferred embodiment of the present invention, an example of which is illustrated in the accompanying drawings.

Figure 1:
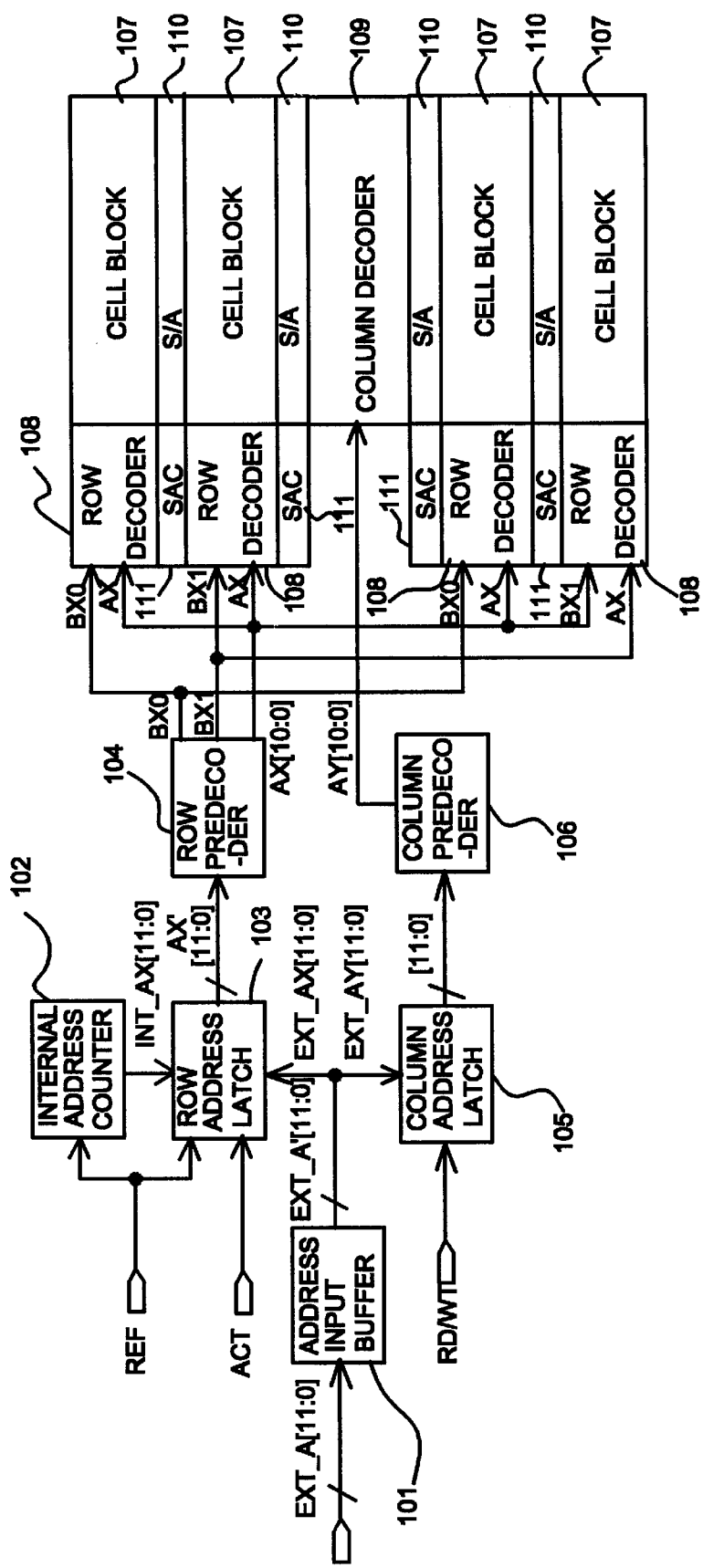
FIG. 1 is a diagram that shows a related art address input stage connected to a memory cell array in semiconductor memory.
Figure 2:
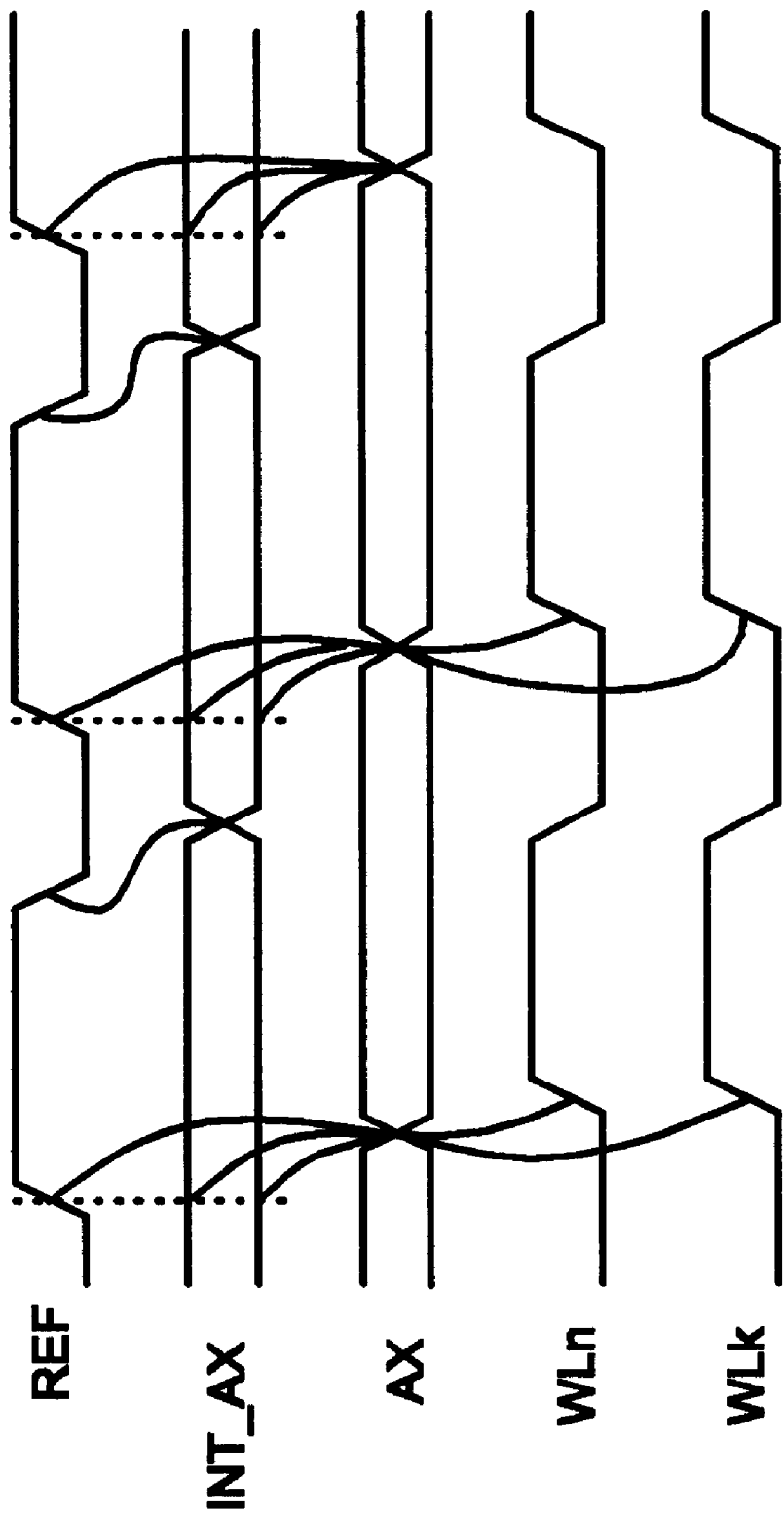
FIG. 2 is a timing diagram that shows operational characteristics of the address input stage in FIG. 1.
Figure 3:
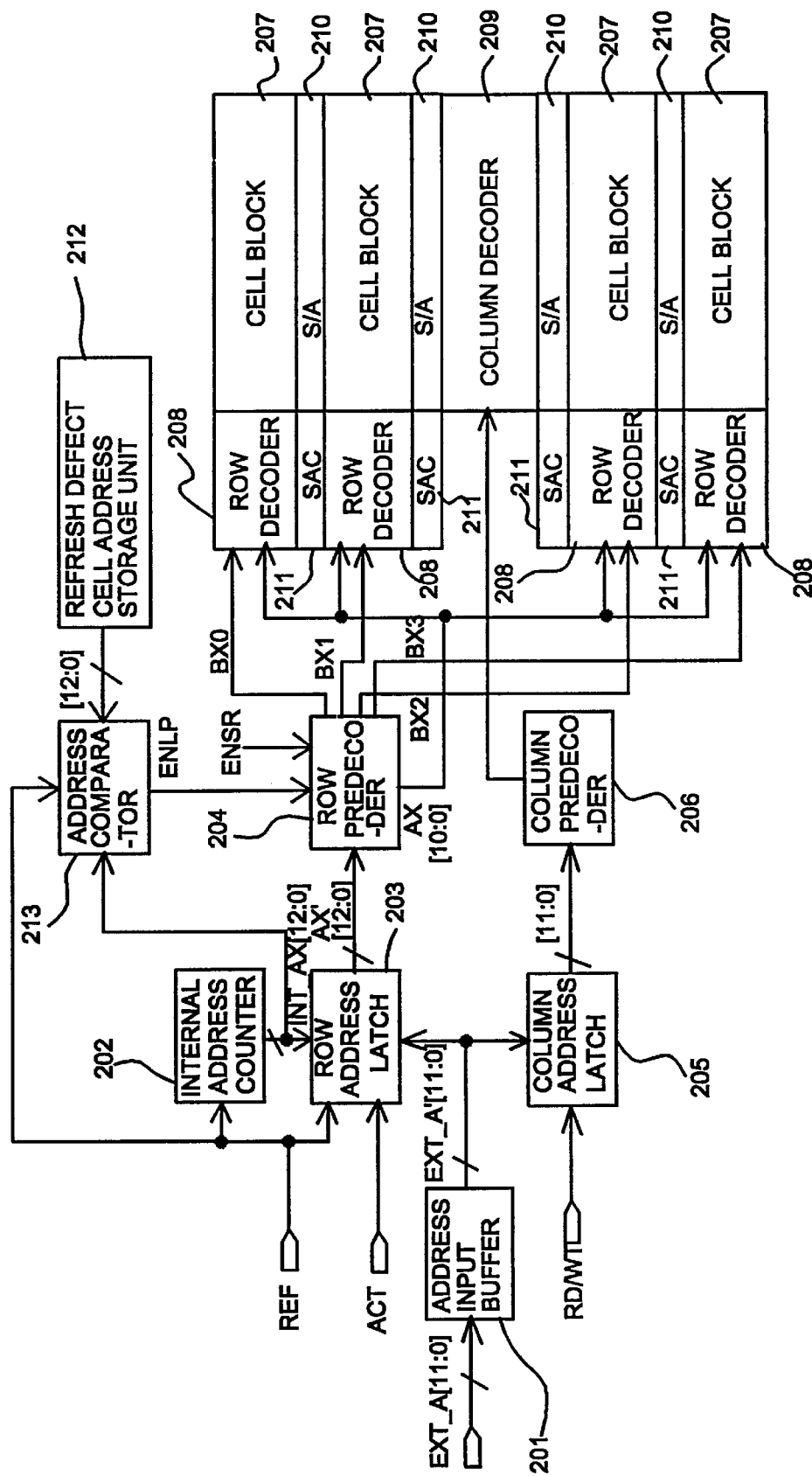
FIG. 3 is a diagram that shows a preferred embodiment of an address input stage in semiconductor memory according to the present invention.

FIG. 3 to FIG. 9 show a preferred embodiment of an address input stage according to present invention. FIG. 3 is a block diagram that shows an address input stage in semiconductor memory according to the present invention. As shown in FIG. 3, The TTL level external address signal of 12 bits is inputted to an address input buffer 201 through an address input pad. The address input buffer 201 converts the external address signal TTL to the CMOS level external address signal EXT_A'. The external address signal EXT_A is comprised of the external row address signal EXT_AX and the external column address signal EXT_AY. These two external address signals EXT_AX and EXT_AY are inputted to the address input buffer 101 alternately. The converted external row address signal EXT_AX is stored in a row address latch 203, and the converted external column address signal EXT_AY is stored in the column address latch 205.

An internal address counter 202 and the row address latch 203 receive a refresh signal REF. When the refresh signal REF is activated to high level, the internal address counter 202 generates an internal address signal INT_AX[12:0] of 13 bits. This internal address signal INT_AX[12:0] is stored in an row address latch 203 in response to the high level refresh signal. The internal address signal INT_AX[12:0] is 13 bits in contrast with the external row address signal EXT_AX[11:0] of 12 bits. In the present invention, the upper 2 bits in the internal address signal INT_AX[13:12] include an added bit for generating a new cell block address signal.

A row address of a refresh defect memory cell is stored in a refresh defect row address storage unit 212. An address comparator 213 compares the internal address signal INT_AX and the row address of the refresh defect memory cell, and generates a low power enable signal ENLP in accordance with the result of the comparison.

As above mentioned, the internal address signal INT_AX or the external row address signal EXT_AX are stored in the row address latch 203. In addition, the refresh signal REF and a wordline driving signal ACT are also supplied to the row address latch 203. The row address latch 203 latches the internal address signal INT_AX when the refresh signal REF is activated to high level, and latches the external row address signal EXT_AX when the wordline driving signal ACT is activated to high level.

A row predecoder 204 receives the external row address signal EXT AX or the internal address signal INT_AX from the row address latch 203, receives the low power enable signal ENLP from the address comparator 213, and receives an automatic or self refresh enable signal ENSR generated from a self refresh mode initiating signal. The self refresh enable signal ENSR can simply be thought of as an external control signal providing additional functionality as explained below.

The row predecoder 204 predecodes the internal address signal INT_AX or the external row address signal EXT_AX.

The predecoding of the internal address signal INT_AX in the row predecoder 204 will now be described. The row predecoder 204 generates four cell block address signals BX0 to BX3 by decoding the upper two bits of the internal address signal INT_AX. At this time, the above-mentioned low power enable signal ENLP and self refresh enable signal ENSR are used as decoding enable signals of the row predecoder. Each of the cell block address signals BX0 to BX3 selects one cell block out of the four.

The remaining bits of the internal address signal INT_AX are used to generate a row address signal AX that selects a single wordline in the cell block selected by the cell block address signals BX0 to BX3.

Each cell block 207 has a row decoder 208 as a main decoder. The row decoder 208 is selected by one of the four cell block address signals BX0 to BX3 and receives the predecoded row address signal AX. The selected row decoder 208 decodes the row address signal AX to select a corresponding wordline.

A column address latch 205 receives the read/write signal RD/WT and the column address signal EXT AY from the address input buffer 201. The column address latch 205 latches the column address signal EXT_AY when the read/write signal is activated. The column address signal EXT_AY stored in the column address latch 205 is supplied to a column predecoder 206. The column predecoder 206 generates a column address signal AY by predecoding the column address signal EXT_AY. A column decoder 209 decodes the predecoded column address signal AY to select a corresponding bitline.

Every cell block 207 has a sense amplifier 210. The sense amplifier 210 is activated by the decoded column address AY, and carries out read/write and refresh operations. A sense amplifier controllers 311, indicated by SAC in FIG. 3, is associated with each sense amplifier 210, and generates a read/write control signal and a refresh control signal to control the sense amplifier 210.

Figure 4:
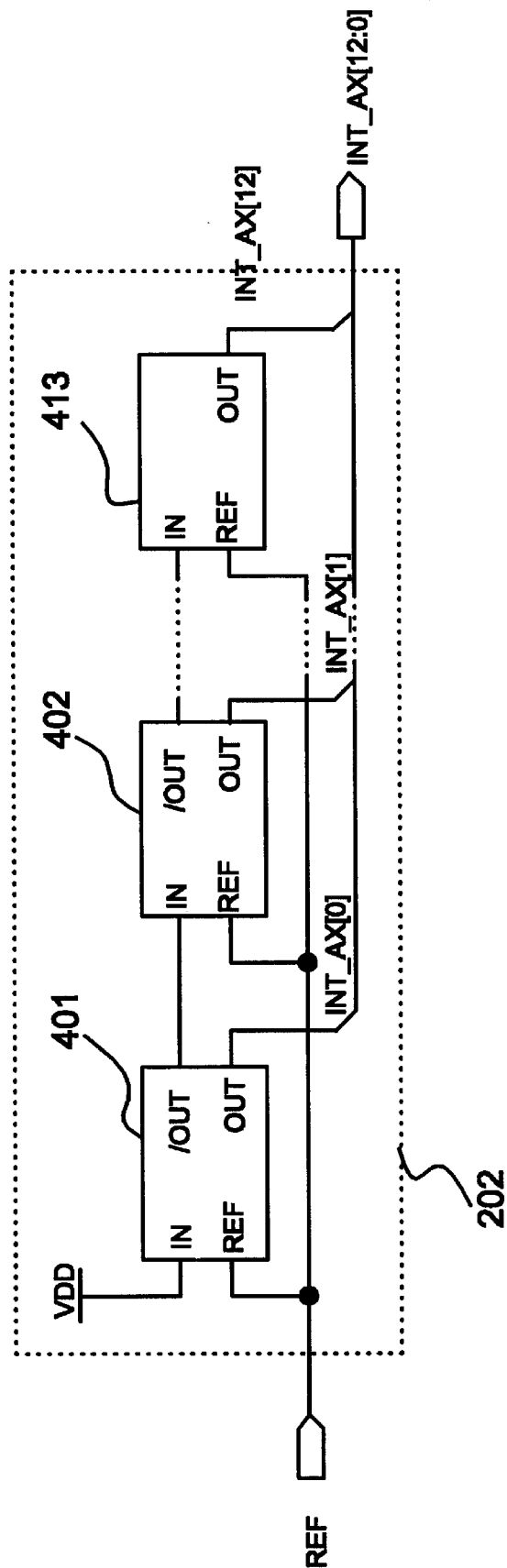
FIG. 4 is a circuit diagram that shows a structure of an internal address counter.

FIG. 4 is a circuit diagram that shows a structure of the internal address counter 202. As shown in FIG. 4, the internal address counter 202 includes 13 counter units 401–413 which are connected in series. Each counter unit 401–413 receives the refresh signal REF as a synchronization signal. In the counter unit stage, except the first one, an inverted output signal/OUT of a previous counter unit is supplied to an input signal IN of the following counter unit.

An input signal IN of the first counter unit 401 is fixed at high level by a supply voltage VDD. An output signal OUT of each counter unit 401–413 forms a bit in the internal address signal INT_AX[12:0] of 13 bits.

Figure 5:
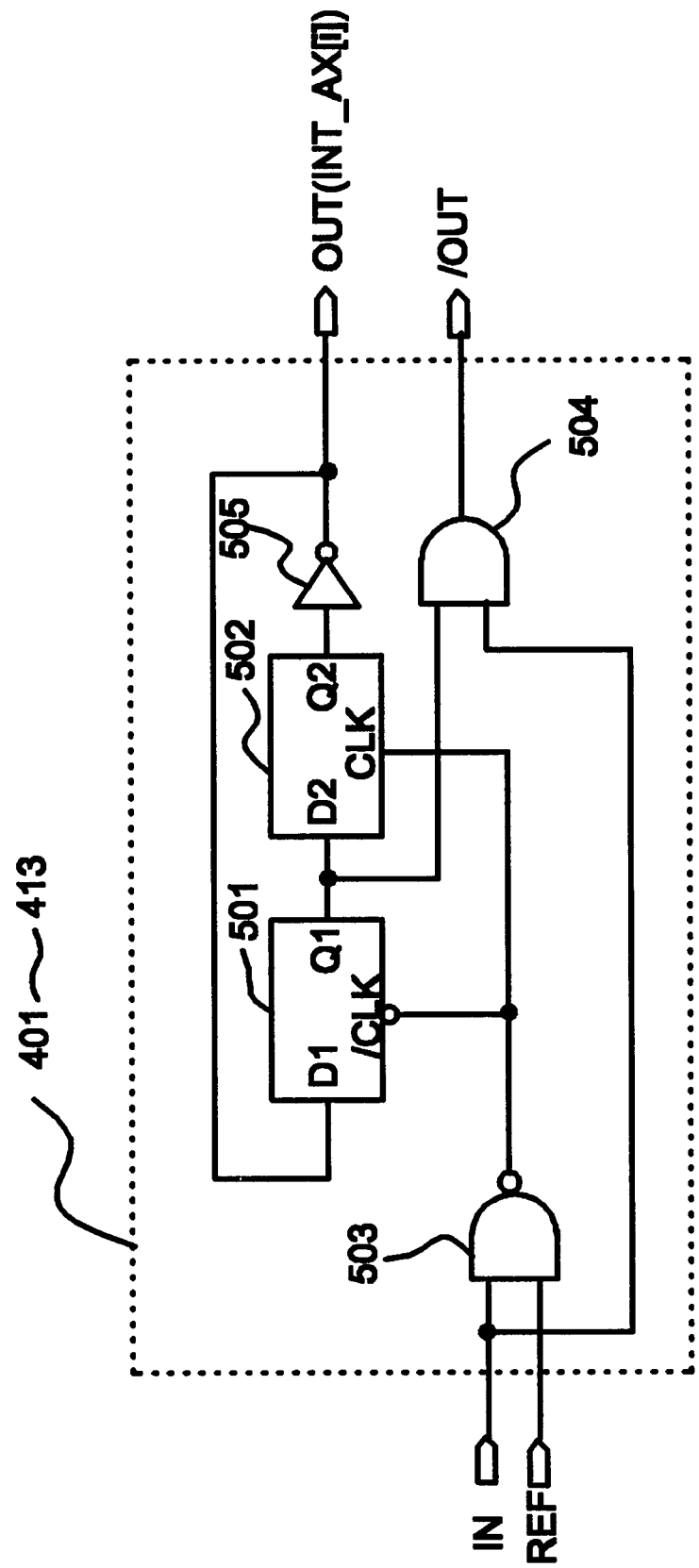
FIG. 5 is a circuit diagram that shows a logic circuit of a counter unit of the internal address counter in FIG. 4.

FIG. 5 is a circuit diagram that shows a logic circuit of each counter unit 401–413 of the internal address counter 202 in FIG. 4. Each counter unit 401–413 is comprised of two D flip-flops 501 and 502 connected in series. As shown in FIG. 5, an output signal Q1 of the first D flip-flop 501 is supplied to the second D flip-flop 502 as data signal D2. An output signal Q2 of the second D flip-flop 502 is inverted by an inverter 505, and this inverted signal is the output signal OUT of the counter unit 401–413. The output signal OUT is fed back to the first D flip-flop 501 as the data D1.

The output signal Q1 of the first D flip-flop 501 and the input signal IN of the counter unit 401–413 becomes the inverted output signal/OUT by operation of an AND gate 504. And, an input signal IN and the refresh signal REF become clock signal CLK and/CLK of the respective D flip-flops 501 and 502 and the AND gate 504 by operation of NAND gate 503.

Figure 6:
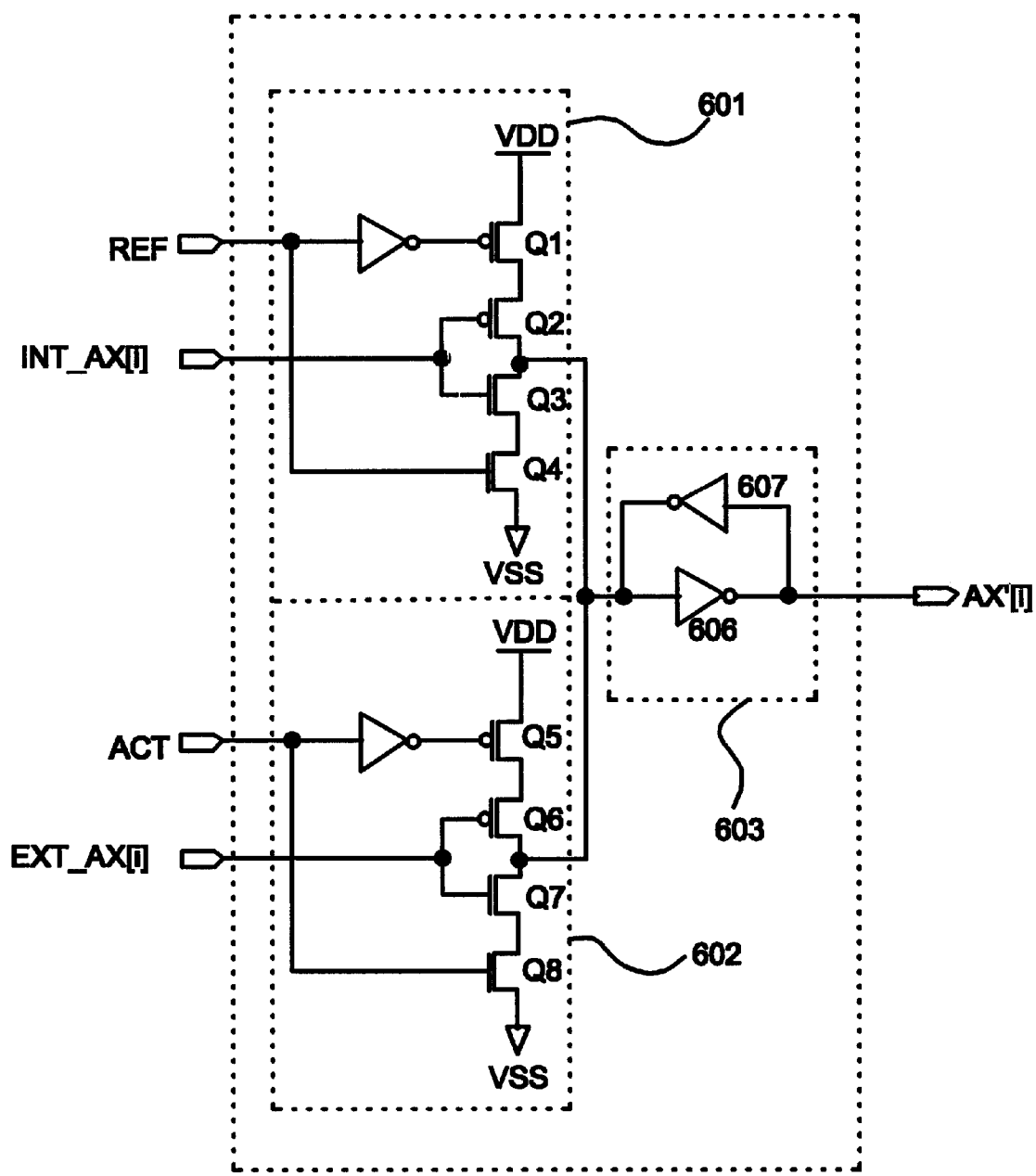
FIG. 6 is a circuit diagram that shows a circuit of a row address latch that latches a unit bit of a row address.

FIG. 6 is a circuit diagram that shows a circuit of the row address latch 203 that latches a unit bit of a row address. As shown in FIG. 6, the row address latch 203 is basically comprised of two clocked CMOS inverts 601 to 602 and a latch 603.

The first clocked CMOS inverter 601 receives the refresh signal REF and a unit bit of the internal address signal INT_AX[i] and generates an inverted unit bit of the internal address signal INT_AX[i] when the refresh signal REF is activated to high level.

The second clocked CMOS inverter 602 receives the wordline driving signal ACT and the unit bit of the external row address signal EXT_AX[i], and generates an inverted unit bit of the external row address signal EXT_AX[i] when the wordline driving signal ACT is activated to high level.

The latch 603 is comprised of two inverters 606 and 607. The latch 603 latches the inverted internal address signal INT_AX[i] from the clocked CMOS inverters 601 and 602 or the inverted external row address signal EXT_AX[i]. And the latch 603 inverts the inverted internal address signal INT_AX[i] or the inverted external row address signal EXT_AX[i]. Thus, the original logic level is restored.

Figure 7:
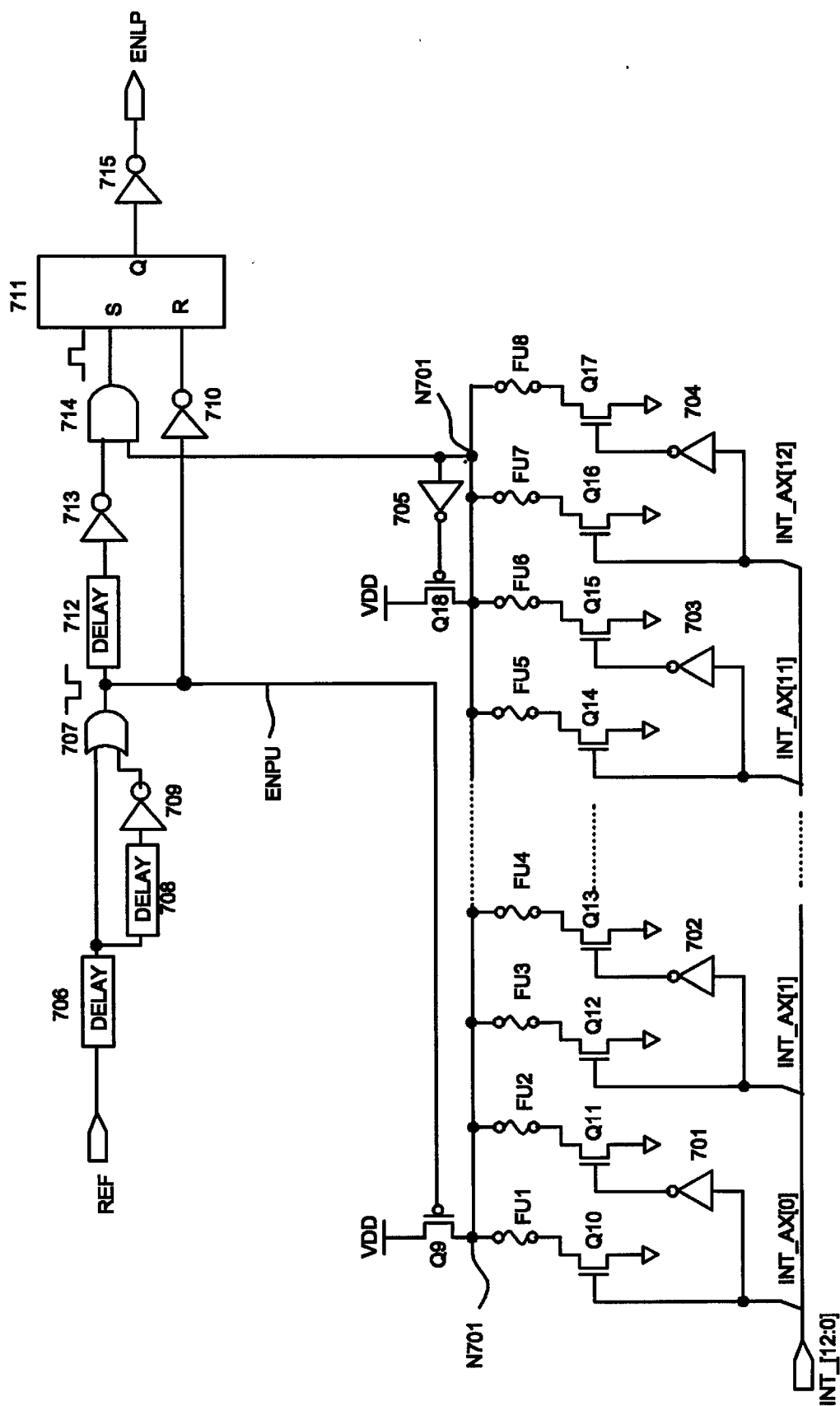
FIG. 7 is a circuit diagram that shows a combined circuit of a refresh defect row address storage unit and an address comparator.

FIG. 7 is a circuit diagram that shows a combined circuit of the refresh defect row address storage unit 212 and the address comparator 213. Although the refresh defect row address storage unit 212 and the address comparator 213 are divided into two separate blocks in FIG. 3, the circuit in FIG. 7 combines the blocks because the circuit components inside the blocks are reciprocally connected with each other.

As shown in FIG. 7, supply voltage VDD is supplied to a source of a PMOS pull up transistor Q9, and a pull-up enable signal ENPU is supplied to a gate of the PMOS pull-up transistor. The pull-up enable signal ENPU will be explained in the following description.

A fuse array, comprised of 26 fuses FU1 to FU26, is connected in parallel to a drain of the PMOS transistor Q9 to form a precharge node N701. The number of fuses FU1 to FU26 is twice the number of bits in the internal address signal INT_AX. The other ends of the fuses FU1 to FU26 are connected to NMOS transistors Q10 to Q17, respectively.

The fuse array is for storage and comparison of the row address of the refresh defect memory cell. The principle of storage and comparison of address bits are explained in the following description with respect to two fuses FU1 and FU2 for storing the least significant bit. It will be appreciated, however, that the fuse array may be replaced by other memory devices such as an EEPROM.

The two fuses FU1 and FU2 store the least significant bit of the row address in the refresh defect memory cell. A logic value of "1" is stored by keeping the first fuse FU1 intact and by blowing (i.e., short circuit) the second fuse FU2. On the other hand, in order to store a logic value of "0", the first fuse FU1 is blown and the second fuse FU2 remains intact.

Two NMOS transistors Q10 and Q11 are connected to the two fuses FU1 and FU2, respectively. The NMOS transistor Q10 is turned on and off by the least significant bit INT_AX[0]. The NMOS transistor Q11 is turned on and off by the inverted least significant bit INT_AX[0].

Assuming that a logic value of "1" was stored by keeping the first fuse FU1 intact and by blowing the second fuse FU2, the precharge node 701 is pulled down to VSS level by turning on the NMOS transistor Q10 provided that the least significant bit INT_AX[0] of the internal address signal is the same logic value as the corresponding stored address bit.

On the other hand, when the least significant bit INT_AX[0] of logic value of "0" is inputted, the NMOS transistor Q10 is turned off and the NMOS transistor Q11 is turned on. However, the precharge node N701 is not pulled down because the fuse FU2 is blown.

Accordingly, the precharge node N701 is pulled down to VSS level provided that the stored address bit coincides with the internal address bit. If not, the precharge voltage is maintained. The same operation occurs with respect to the other fuses and bits of the internal address signal INT_AX.

Another pull-up transistor of PMOS transistor Q18 is connected to the precharge node N701. The PMOS transistor Q18 is controlled by the output of an inverter 705. Logic value output from the inverter 705 is in accordance with the voltage level of the precharge node N701. Accordingly, when the precharge node N701 is high level, the PMOS transistor Q18 turns on. Thus, the precharge level is fixed to high level. The remaining parts, except for the fuse array, in FIG. 7 generate a low power enable signal ENLP and a pull-up enable signal ENPU, which controls the PMOS transistor Q9.

A refresh signal REF is inputted to an OR gate 707 through a first delay 706. The refresh signal having been delayed through the first delay 706 is inputted to two input terminals of a two-input OR gate 707. One input terminal of the OR gate 707 is directly supplied with the refresh signal REF having passed through the first delay 706, while the other input terminal is supplied with the delayed refresh signal having been through a second delay 708 and an inverter 709.

An output of the OR gate 707 is a pull-up enable signal ENPU, which is a negative short pulse signal. Namely, when the refresh signal REF transitions from high to low level, a negative short pulse signal having a low level section amounting to the delay time of the second delay 708 is generated. Also, the output of the OR gate 707 may be used for generating a low power enable signal ENLP.

The first delay 706 delays the generation of the pull-up enable signal ENLP or the low power enable signal ENPU in the above explanation. As the internal address signal INT_AX is also generated by the refresh signal REF, the generation of the low power enable signal ENLP is delayed by the first delay 706 until the internal address signal INT_AX has been generated.

The pull-up enable signal ENPU outputted from the OR gate 707 turns on/off the PMOS transistor Q9 in the fuse array on/off, and is inverted by an inverter 710 for use as a reset signal R of an RS flip-flop 711. Preferably, the RS flip-flop 711 is implemented using NAND gates in the well-known manner. The pull-up enable signal ENPU is inputted to an input terminal of a two-input AND gate 714 through a third delay 712 and an inverter 713. The other input terminal of the AND gate 714 is supplied with a logic value in accordance with the voltage level of the precharge node N701. Accordingly, if a pull-up enable signal ENPU is generated from the OR gate 707 while the voltage of the precharge node N701 maintains high level, the pull-up enable signal ENPU is inverted by the inverter 710 to reset the RS flip-flop 711.

Besides, the pull-up enable signal ENPU is inputted to the AND gate 714 through the third delay 712 and the inverter 713. Then, an output of the AND gate 714 becomes a positive short pulse signal to set the RS flip-flop. Namely, if the row address of the defect memory cell stored by the fuse array and the internal row address do not coincide, the AND gate 714 will become a positive short pulse signal. At this time, the reset signal from the inverter 710 is logic low such that the output of the RS flip-flop goes L. As a result, the low power enable signal is activated and goes logic high. By contrast when the row address of the defect memory cell stored by the fuse array and the internal row address coincide, the AND gate 714 will output a logic low value while the reset signal from the inverter 710 is logic low. As a result, the output Q of the RS flip-flop 711 is logic high, an the low power enable signal is deactivated and goes logic low for an amount of time equal to the delay of the third delay.

Figure 8A:
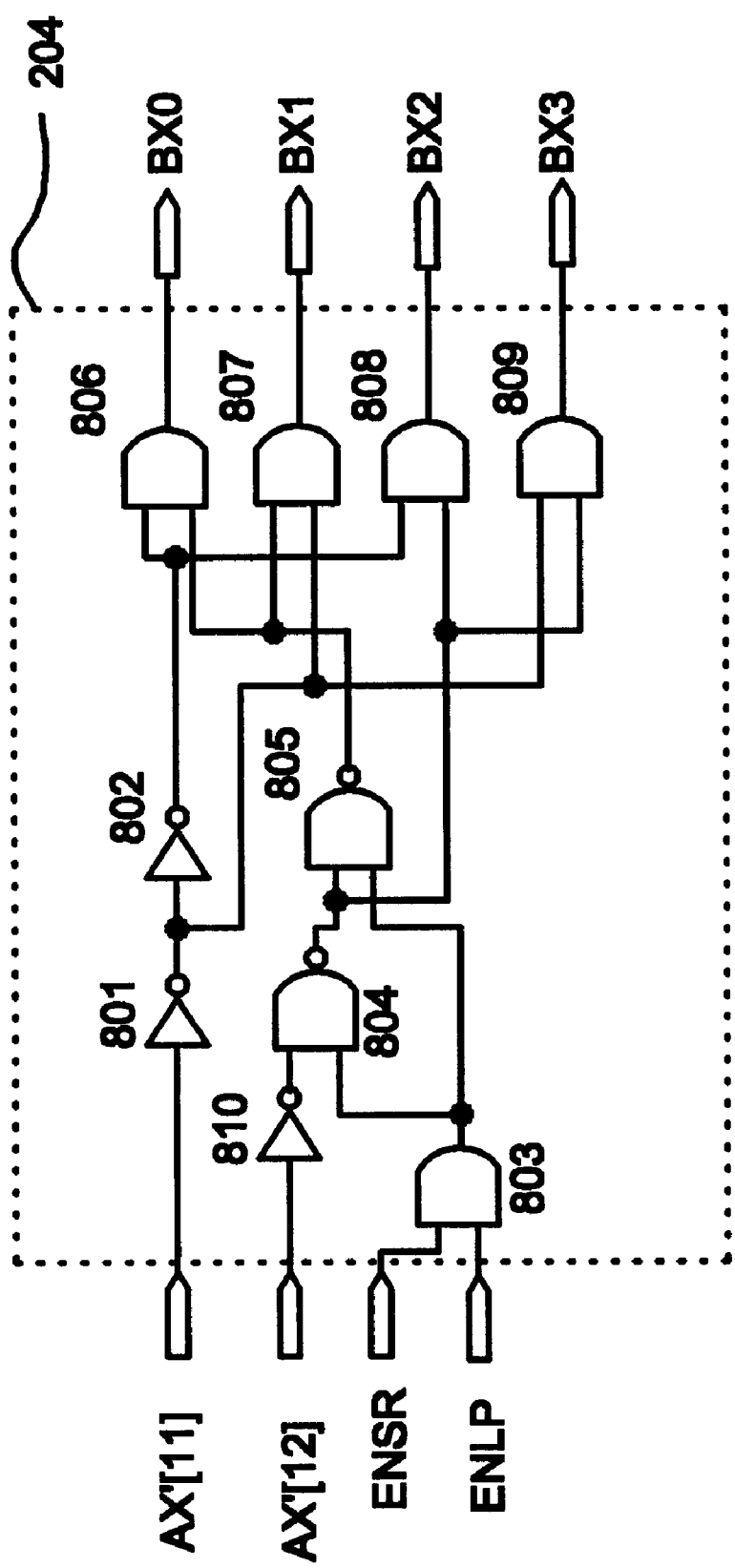
FIG. 8A is a circuit diagram that shows a logic circuit of a row address decoder.

FIG. 8A is a circuit diagram that shows a logic circuit of a row address decoder 208. As shown, an inverter 801 receives the $12^{th}$ bit AX'[11] of the row address, an inverter 810 receives the most significant bit AX'[12] of the row address, and an AND gate 803 receives both the self refresh enable signal ENSR and the low power enable signal ENLP. A NAND gate 804 receives the output of the inverter 810 and the AND gate 803, and a NAND gate 805 receives the output of the NAND gate 804 and the AND gate 803. Also, an inverter 802 receives the output of the inverter 801. An AND gate 806 generates the block address signal BX0 by ANDing the outputs of the inverter 802 and the NAND gate 805. An AND gate 807 generates the block address signal BX1 by ANDing the output of the NAND gate 805 and the inverter 801. An AND gate 808 generates the block address signal BX2 by ANDing the outputs of the inverter 802 and the NAND gate 804, and an AND gate 809 generates the block address signal 809 by ANDing the outputs of the NAND gate 804 and the inverter 801.

When the logic value of at least one of an automatic or self refresh enable signal ENSR and the low power enable signal ENLP is "0", (1) the two block address signals BX1 and BX3 have the same value regardless of the logic value of the most significant bit AX'[12] of the row address and (2) the logic values of other two block address signals BX0 and BX2 are identical as well. However, when the logic values of both the self refresh enable signal ENSR and the low power enable signal ENLP are "1", each block address signal has the logic value of "1" according to the combination of the 12th upper bit AX'[11] and the most significant bit AX'[12] of the row address AX.

Consequently, when at least one logic value of the self refresh enable signal ENSR and the low power enabling signal ENLP is "0", two cell arrays are selected simultaneously by a single address input. But, when both logic values of the self refresh enable signal ENSR and the low power enable signal ENLP are "1", only one cell array is selected by a single address input. Such operational characteristics are shown in FIG. 8B.

FIG. 9 is a timing diagram of the operational characteristics of an address input stage. Referring to FIG. 9, a time t1 from a first descendent edge of a refresh signal REF to a descendent edge of a low power enable signal ENLP is caused by the first delay 706 in FIG. 7 and a time t2 of a low level section of a low power enable signal ENLP is caused by the third delay.

Two wordlines WLn and WLk have the same row address in different cell blocks. Relating a section where the wordlines WLn and WLk are activated to a level of the low power enable signal ENLP, one WLn of the two wordlines WLn and WLk is activated only when the low power enable signal ENLP is at a high level. When the low power enable signal ENLP is at a low level, both wordlines WLn and WLk are activated. This means that a refresh defect memory cell is connected to the wordline WLk. Accordingly, when a wordline having the same address as the refresh defect memory cell in another cell block is refreshed, the refresh defect memory cell is also refreshed.

According to the present invention, power consumed in the refresh operation is greatly reduced by refreshing each cell block of a memory cell array comprised of a plurality of cell blocks in turn. Refresh defect memory cells require more refresh operations than normal memory cells. When a non-defect memory cell having the same address as a refresh defect memory cell is refreshed, the refresh defect memory cell is refreshed. In the related art, many memory cells become useless due to refresh defects because there are an insufficient number of redundant cells to replace the defective memory cells. However, in the new refresh controller according to the present invention even some of the refresh defect memory cells not replaced by redundant memory cells can be used.

It will be apparent to those skilled in the art that various modifications and variations can be made in a refresh controller in semiconductor memory of the present invention without departing from the spirit or scope of the inventions. Thus, it is intended that the present invention cover the modifications and variations of this invention provided they come within the scope of the appended claims and equivalents.

What is claimed:

1. A semiconductor memory, comprising:

a plurality of cell blocks, each cell block including a plurality of memory cells; and a refresh controller refreshing a refresh defect cell in one of said cell blocks when a memory cell in a different one of said cell blocks which is designated by a same address as said refresh defect cell, is refreshed.

2. The semiconductor memory of claim 1, wherein said refresh controller comprises:

an internal address generator generating an internal address in response to a refresh signal;

a low power enable signal generator storing an address of said refresh defect cell and generating a low power enable signal based on said stored address and said internal address; and an address decoder simultaneously selecting at least a first and second cell block from said cell blocks based on said low power enable signal, said first cell block including a memory cell having said internal address and said second cell block including said refresh defect cell.

3. The semiconductor memory of claim 2, wherein said low power enable signal generator compares said stored address and said internal address, and generates an inactive low power enable signal when said stored address and said internal address coincide; and said address decoder simultaneously selects said first and second cell blocks when said low power enable signal is inactive.

4. A refresh controller in semiconductor memory, said semiconductor memory including a plurality of cell blocks, each having a plurality of memory cells, said refresh controller comprising:

an internal address generator generating an internal address in response to a refresh signal;

a low power enable signal generator storing an address of said refresh defect cell and generating a low power enable signal based on said stored address and said internal address; and an address decoder simultaneously selecting at least a first and second cell block from said cell blocks based on said low power enable signal, said first cell block including a memory cell having said internal address and said second cell block including said refresh defect cell.

5. The refresh controller of claim 4, wherein said low power enable signal generator compares said stored address and said internal address, and generates an inactive low power enable signal when said stored address and said internal address coincide; and said address decoder simultaneously selects said first and second cell blocks when said low power enable signal is inactive.

6. The refresh controller of claim 5, wherein said low power enable signal generator generates an active low power enable signal when said stored address and said internal address do not coincide; and said address decoder selects said cell blocks one at a time when said low power enable signal is active.

7. The refresh controller of claim 4, wherein said low power enable signal generator generates an active low power enable signal when said stored address and said internal address do not coincide; and said address decoder selects said cell blocks one at a time when said low power enable signal is active.

8. The refresh controller of claim 4, wherein said internal address includes a number of bits great er than a least number of bits required for selecting said cell blocks.

9. The refresh controller of claim 4, wherein said internal address generator comprises:

a plurality of counter units connected in series, each output of said counter units supplying one bit of said internal address, and each of said counter units being enabled by said refresh signal.

10. The refresh controller of claim 4, wherein said low power enable signal generator comprises:

a memory storing said stored address.

11. The refresh controller of claim 10, wherein said memory is a fuse array.

12. The refresh controller of claim 10, wherein said memory is an electrically erasable programmable read only memory.

13. The refresh controller of claim 10, wherein said low power enable signal generator further comprises:

a comparator comparing said internal address and said stored address; and a signal generator generating said low power enable signals such that said low power enable signal is inactive when said comparator indicates that said internal address and said stored address coincide.

14. The refresh controller of claim 13, wherein said signal generator comprises:

a delay delaying operation of said comparator until after said internal address generator has generated said internal address.

15. The refresh controller of claim 14, wherein said signal generator generates said low power enable signal such that said low power enable signal is inactive for a predetermined period of time when said comparator indicates said internal address and said stored address coincide.

16. The refresh controller of claim 4, wherein said address decoder selects said cell blocks in response to said low power enable signal and a self refresh mode enable signal.

17. A method of controlling refresh in semiconductor memory that includes a plurality of cell blocks, each cell block including a plurality of memory cells, comprising:

refreshing a refresh defect cell in one of said cell blocks when a memory cell in a different one of said cell blocks which is designated by a same address as said refresh defect cell, is refreshed.

18. The method of claim 17, wherein said refreshing step comprises:

first generating an internal address in response to a refresh signal;

second generating a low power enable signal based on a stored address and said internal address; and simultaneously selecting at least a first and second cell block from said cell blocks based on said low power enable signal, said first cell block including a memory cell having said internal address and said second cell block including said refresh defect cell.

19. The method of claim 18, wherein said second generating step includes, comparing said stored address and said internal address, and third generating an inactive low power enable signal when said stored address and said internal address coincide; and said selecting step simultaneously selects said first and second cell blocks when said low power enable signals is inactive.

20. The refresh controller of claim 19, wherein said second generating step generates an active low power enable signal when said stored address and said internal address do not coincide; and said selecting step selects said cell blocks one at a time when said low power enable signal is active.

21. The refresh controller of claim 18, wherein said second generating step generates an active low enable power signal when said stored address and said internal address do not coincide; and said selecting step selects said cell blocks one at a time when said low power enable signal is active.

* * * * *